United States Patent
Butler

(10) Patent No.: US 7,382,439 B2
(45) Date of Patent: Jun. 3, 2008

(54) LITHOGRAPHIC APPARATUS AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 25 days.

(21) Appl. No.: 11/139,992

(22) Filed: May 31, 2005

(65) Prior Publication Data

US 2006/0268247 A1 Nov. 30, 2006

(51) Int. Cl.
*G03B 27/72* (2006.01)
*G03B 27/42* (2006.01)
*G03B 27/32* (2006.01)

(52) U.S. Cl. ............... 355/71; 355/53; 355/77
(58) Field of Classification Search ............... 355/53, 355/67, 71, 74, 75, 77; 430/394, 397; 359/857, 359/858
See application file for complete search history.

(56) References Cited

U.S. PATENT DOCUMENTS

| | | | | |
|---|---|---|---|---|
| 5,559,583 A | * | 9/1996 | Tanabe | 355/71 |
| 5,854,671 A | * | 12/1998 | Nishi | 355/53 |
| 6,172,825 B1 | * | 1/2001 | Takahashi | 359/859 |
| 6,348,303 B1 | * | 2/2002 | Van Der Lei et al. | 430/397 |
| 6,577,379 B1 | * | 6/2003 | Boettiger et al. | 355/52 |
| 6,757,051 B2 | * | 6/2004 | Takahashi et al. | 355/67 |
| 6,803,992 B2 | * | 10/2004 | Tokuda et al. | 355/53 |
| 6,859,263 B2 | * | 2/2005 | Naulleau | 355/67 |
| 2004/0227922 A1 | * | 11/2004 | Dierichs et al. | 355/71 |
| 2005/0012913 A1 | * | 1/2005 | Verweij et al. | 355/53 |
| 2005/0162629 A1 | * | 7/2005 | Moors et al. | 355/67 |

FOREIGN PATENT DOCUMENTS

EP 0 744 663 A1 * 5/1995

\* cited by examiner

*Primary Examiner*—Alan A Mathews
(74) *Attorney, Agent, or Firm*—Pillsbury Winthrop Shaw Pittman, LLP

(57) ABSTRACT

A lithographic apparatus includes a mask or reticle masking device configured to block radiation. The masking device includes a reflective blade. The reflective blade may include a mirrored blade, which may be used in the scanning (Y) direction, and which moves across the beam of radiation in use. The reflective blade provides within an illumination system an effective slit for a mask or reticle within the lithographic apparatus.

34 Claims, 14 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method. The present invention also relates to a mask or reticle masking device for use in a lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one, or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam of radiation in a given direction (the "scanning" direction) while synchronously scanning the substrate parallel or anti-parallel to this direction.

A prior art lithographic apparatus includes an illumination system configured to provide a beam of radiation, wherein the illumination system defines a focal plane through which, in use, the beam of radiation passes; a support configured to support a patterning device at a location, the patterning device configured to pattern the beam of radiation according to a desired pattern; a masking device for obscuring at least a part of the patterning device from the beam of radiation, the masking device including a first masking device arranged to obscure part of the location in a first direction with respect to the location, a second masking device arranged to obscure part of the location in a second different direction with respect to the location; a substrate table configured to hold a substrate; a projection system configured to project the patterned beam onto a target portion of the substrate.

The term "patterning device" should be broadly interpreted as referring to a device that can be used to endow an incoming radiation beam with a patterned cross-section, corresponding to a pattern that is to be created in a target portion of the substrate; the term "light valve" has also been used in this context. Generally the pattern will correspond to a particular functional layer in a device being created in the target portion, such as an integrated circuit or other device (see below). Examples of such patterning device include a mask. The concept of a mask is well known in lithography, and includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

A programmable mirror array is another example of a pattering device. The array is a matrix addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the addressable surface. An alternative embodiment of a programmable mirror array employs a matrix arrangement of small mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required addressing can be performed using suitable electronic means.

Another example of a pattering device is a programmable LCD array. As above, the support in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereinabove set forth.

For the sake of simplicity, the projection system may hereinafter be referred to as the "projection lens" or "lens"; however, this term should be broadly interpreted as encompassing various types of projection system, including refractive optics, reflective optics, and catadioptric systems, for example. The radiation system may also include components operating according to any of these design types to direct, shape or control the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory processes may be carried out on one or more tables while one or more other tables are being used for exposures.

Lithographic apparatus can be used, for example, in the manufacture of integrated circuits (ICs). In such a case, the patterning device may generate a circuit pattern corresponding to an individual layer of the IC, and this pattern can be imaged onto a target portion (including one or more dies) on a substrate (silicon wafer) that has been coated with a layer of radiation-sensitive material (resist). In general, a single wafer will contain a whole network of adjacent target portions that are successively irradiated via the projection system, one at a time. In prior art apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the beam of radiation in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned.

It is often desirable or necessary to ensure that only a certain part of the mask is imaged by the beam of radiation to the substrate. For example, the mask may contain more than one pattern of which only one is used for a given exposure. It is also often desirable or necessary to stop stray light from impinging on the substrate. In lithographic projection systems using this function such is typically achieved by providing a reticle masking device at an intermediate plane in the illuminator.

There are currently two types of reticle masking schemes: masking for static exposure in a stepper system and masking for scanning exposure in a step-and-scan apparatus. In a stepper system where the mask is fixed with respect to the illuminator, the reticle masking device is provided adjacent to the mask and is also fixed with respect to the illuminator and the mask. In static exposure, part of the mask is blocked from the illumination beam for the duration of an exposure. In a step-and-scan system where the mask is movable with respect to the illuminator, the reticle masking device is provided adjacent to the mask and is also movable with respect to the illuminator and the mask. In scanning exposure, a part of the mask is blocked for a predetermined length of time.

A reticle masking device may include at least one movable blade. In certain devices two sets of moveable blades are provided. Typically the two sets of blades are mechanically coupled to a support frame and each support is mounted on a common frame. Thus the sets of blades are mechanically coupled to each other.

FIGS. 17(a) and 17(b) depict a conventional masking device MD, which may be used in a lithographic apparatus. The masking device MD is disposed in an XY plane, X being substantially perpendicular to Y and the XY plane being substantially perpendicular to the Z-direction. The masking device MD includes four movable blades arranged in two pairs X1 and X2, disposed along the X axis, and Y1 and Y2 disposed along the Y axis. As shown in plan view in FIG. 17(a), each blade forms an L-shape, with a rectangular portion disposed close to the Z-axis and an arm which extends away from the Z-axis so that the blades may be connected to suitable actuators. Blades X1 and X2 are movable in the X-direction, and blades Y1 and Y2 are moveable in the Y-direction.

The cross-sectional view in FIG. 17(b) shows how the blades are arranged in the Z-direction to allow them to overlap. Note that in practice the blades are made very thin in the Z-direction, and the X and Y blades are very close together in Z such that the four blades form a rectangular slit SL lying in an optical position along the Z-direction.

FIG. 17(b) also shows an embodiment of the masking device lens MDL, including two lenses LS1 and LS2, where a lens may be a single optical element or a group of optical elements.

In step mode, the position and size of the masking slit (SL, FIG. 17(a)) is chosen such that the beam of radiation PB will be incident upon the required circuit pattern of the patterning device MA. The masking device MD is kept relatively stationary and the entire circuit pattern is projected onto the target portion C in a single static exposure.

In scan mode, the masking device MD is configured to form a masking slit SL having a larger dimension in the X-direction than the Y-direction. For scanning exposures, Y1 and Y2-blades are arranged to be movable during the exposure, and X1 and X2-blades, although movable, are generally arranged to be stationary during the exposure. For scanning exposures, the Y1 and Y2-blades in particular are arranged to perform additional movements to allow scanning of the patterning device MA with respect to the beam of radiation PB.

Before a scanning cycle starts, the Y-blades are arranged to prevent any radiation impinging on the patterning device MA. At the beginning of the scanning cycle, the Y-blades open to a scanning distance. At the end of the scanning cycle, the Y-blades move into a position in which light is prevented from impinging on the patterning device MA.

In case a different portion of the patterning device needs to be masked, the X-blades are generally moved between consecutive exposures.

With conventional masking devices, as higher scanning speeds are demanded, conventional masking devices fail. In particular, with some conventional masking devices the mass of the coupled blades creates inertia, preventing the scanning blades from being able to be accelerated and decelerated fast enough to open to their scanning position, and close at the end of the scan position, respectively. Further, the high moving mass cannot be satisfactorily moved at high enough scanning speeds by conventional motors without causing disturbances to be transferred to other parts of the apparatus.

Additionally, at the start and end of the scans the X- and Y-blades, collectively referred to as reticle masking blades, respectively open and close an illumination slit. For this purpose, two scanning blades are used in the Y-direction. When blocking radiation the blades must absorb a substantial amount of energy from an illumination source, e.g. a laser source. This gives rise to thermal problems. Further, two Y-blades must be moved requiring two motors, amplifiers, etc.

Motors for driving the blades are controlled by software which includes a list of instructions to control the motors. In conventional reticle masking devices it is possible for blades to collide with one another in the case of a malfunction. This may not only damage the blades, but will affect production if the apparatus is shut down for repairs.

SUMMARY OF THE INVENTION

According to an embodiment of the present invention, a lithographic apparatus includes an illumination system configured to provide a beam of radiation; a support configured to support patterning device, the patterning device being configured to impart the beam of radiation with a pattern in its cross-section; a substrate table configured to hold a substrate; a projection system configured to project the patterned beam onto a target portion of the substrate; and a masking device configured to obscure a portion of the patterning device from the beam of radiation and comprising one reflective element configured to reflect a portion of the beam of radiation.

By "reflective element" it is meant that the reflective element reflects at least radiation having a wavelength of the beam of radiation.

Thermal issues are reduced or effectively removed as the reflective blade does not absorb a substantial amount of radiation, but substantially reflects the radiation, in use. In other words, because of the use of a reflective element, instead of a light-blocking principle, substantially no radiation energy is absorbed by the reflective element, and hence comparatively no thermal issues arise.

The reflective element may be a mirror, mirrored or mirroring blade.

The masking device may mask at least a portion of the patterning device, e.g. mask or reticle, from the beam of radiation, in use.

In one embodiment, radiation reflected from the reflective blade, in use, may be used to expose the patterning device and substrate.

The reflective blade may be movable.

The masking device may include a movable radiation absorbing blade having a slit. Radiation may pass through the slit, in use, to the reflective blade which may be fixed in position.

The reflective blade may include or provide a hole or slit through which, in use, radiation passes.

A direction of passage of radiation, in use, may be defined as a Z-direction.

The reflective blade may include a single reflective blade which may be disposed and movable in a manner to provide masking of the patterning device from radiation in one direction, e.g. a Y-direction, perpendicular to the Z-direction.

The one direction may include a scanning direction.

Thus, the two scanning Y-blades of the prior art may be replaced by a single reflective blade. At the start of a scan, the reflective blade may be moved into the beam of radiation, and an effective "slit" or illumination beam may be opened. When a complete "slit" or illumination beam provided by the blade is open, the blade may be stopped. At the end of a scan, the blade may again be moved in a same direction and the "slit" or illumination beam may be closed.

Masking of the radiation in an X-direction, perpendicular to the Z- and Y-directions may be provided by a pair of X-blades, which X-blades may provide a slot, and which X-blades may be movable relative to one another.

The reflective blade may be disposed in the illumination system.

The reflective blade may be disposed to intersect an input radiation path at any angle, e.g. an acute angle, for example between 30° and 60°, and for example around 45°.

The apparatus may include a moving device configured to move the reflective blade, e.g. back and forth, and may move such with an acceleration/deceleration of around 250 m/s$^2$.

The reflective blade may be made from a substrate with a high reflective coating, of which the composition of both the substrate and reflective coating may be designed for the radiation in use. As an example, a quartz substrate coated with a combination of silicon oxide and aluminium oxide ($SiO_2/Al_2O_3$) may be chosen, e.g. for a wavelength of 248 nm.

The beam of radiation may have a wavelength in the ultraviolet (UV) region or the extreme ultraviolet (EUV) region.

The lithographic apparatus may be adapted for use at a wavelength selected from one of 365, 248, 193, 157, 126 nm, or a wavelength of between 5 and 20 nm (extreme ultraviolet).

The X-blades may be disposed in a focal plane of the illumination system. The projection beam or illumination beam preferably passes through the focal plane, in use.

The Y-blade may be disposed optically upstream or alternatively optically downstream of the X-blades.

The moving device may include first and second motors, the use of two motors allowing the reflective blade to be driven in its center of mass.

The masking device may obscure at least a part of the patterning device from the beam of radiation. The masking device may include a first masking device arranged to obscure part of a location at which the patterning device is supported in a first direction with respect to the location, and a second masking device arranged to obscure part of the location in a second different direction with respect to the location.

The first masking device may include the reflective blade, e.g. a Y-blade.

The second masking device may include the pair of blades or X-blades, e.g. non-reflecting blades.

In an alternative embodiment there may be provided first and second reflective blades.

In a further alternative embodiment, there may be provided a polarizer configured to polarize the beam of radiation.

In use, the beam of radiation may be masked by the masking device prior to exposure to the patterning device.

According to another embodiment of the present invention, a lithographic apparatus includes a masking device (mask or reticle masking device) including a reflective blade.

According to a further embodiment of the present invention, a reflective blade is provide for use in a lithographic apparatus.

According to a still further embodiment of the present invention, a device manufacturing method includes providing a beam of radiation using an illumination system; using a patterning device to impart the beam of radiation with a pattern in its cross-section; projecting the patterned beam of radiation onto a target portion of a substrate; and masking a part of the patterning device from the beam of radiation using a masking device including a reflective element.

In a manufacturing process using a lithographic projection apparatus according to the invention, a pattern (e.g. in a mask), may be imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures such as a post-exposure bake (PEB), development, a hard bake and measurement/inspection of the imaged features. This array of procedures is used as a basis to pattern an individual layer of a device, e.g. an IC. Such patterned layer may then undergo various processes such as etching, ion-implantation (doping), metalisation, oxidation, chemo-mechanical polishing, etc, all intended to finish off an individual layer. If several layers are required, then the whole procedure, or a variant thereof, may have to be repeated for each new layer. Eventually, an array of devices will be present on the substrate (wafer). These devices are then separated from one another by a technique such as dicing or sawing, whence the individual devices can be mounted on a carrier, connected to pins, etc.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 5 to 20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam may be patterned.

The support normally supports, e.g. bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components to direct, shape, or control the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory processes may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied in other spaces in the lithographic apparatus, for example, between the mask and the first element of the projection system. Immersion techniques are well known in the art for increasing the numerical aperture (NA) of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
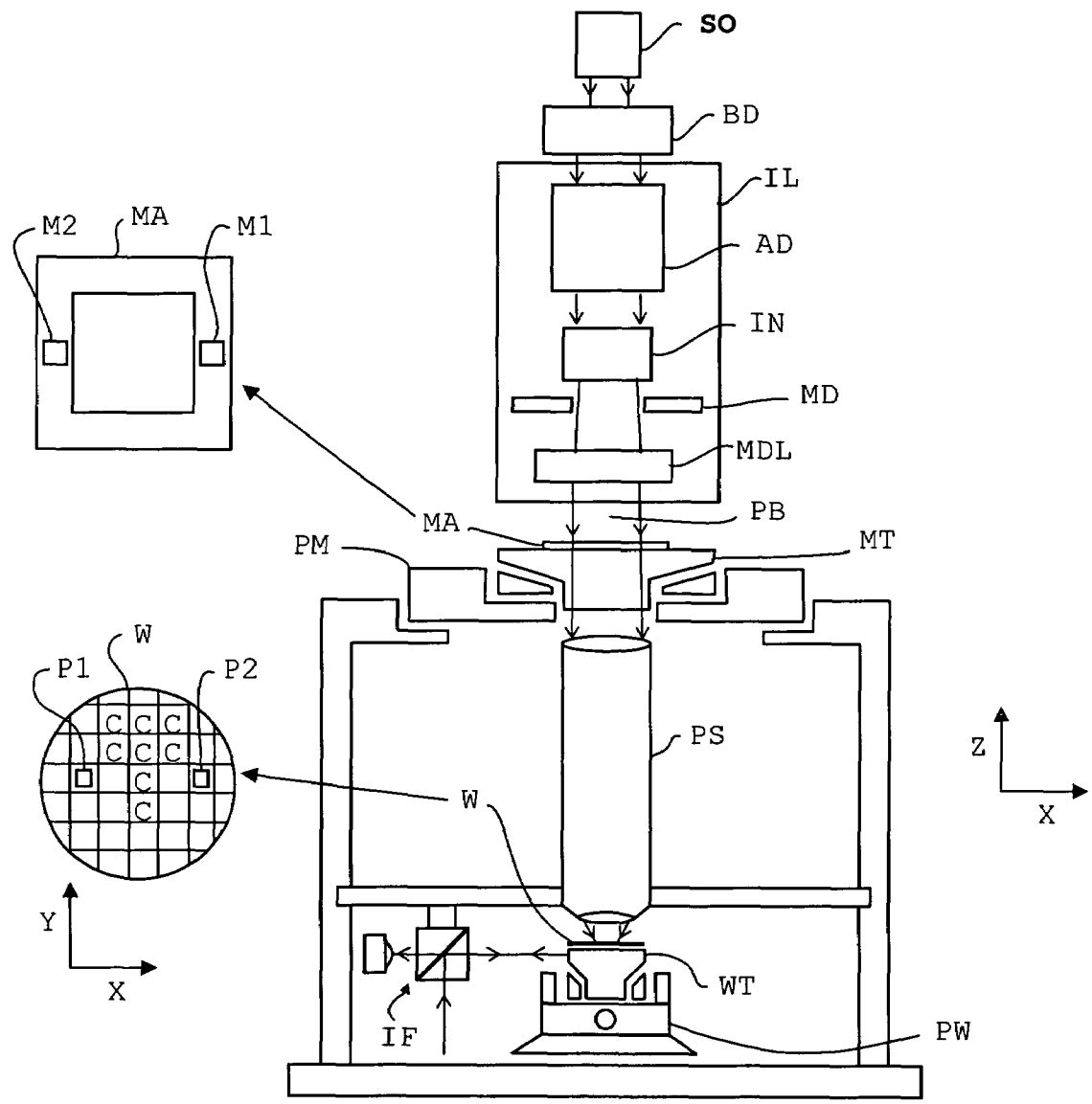
FIG. 1 depicts a lithographic apparatus according to a first embodiment of the invention.
Figure 2:
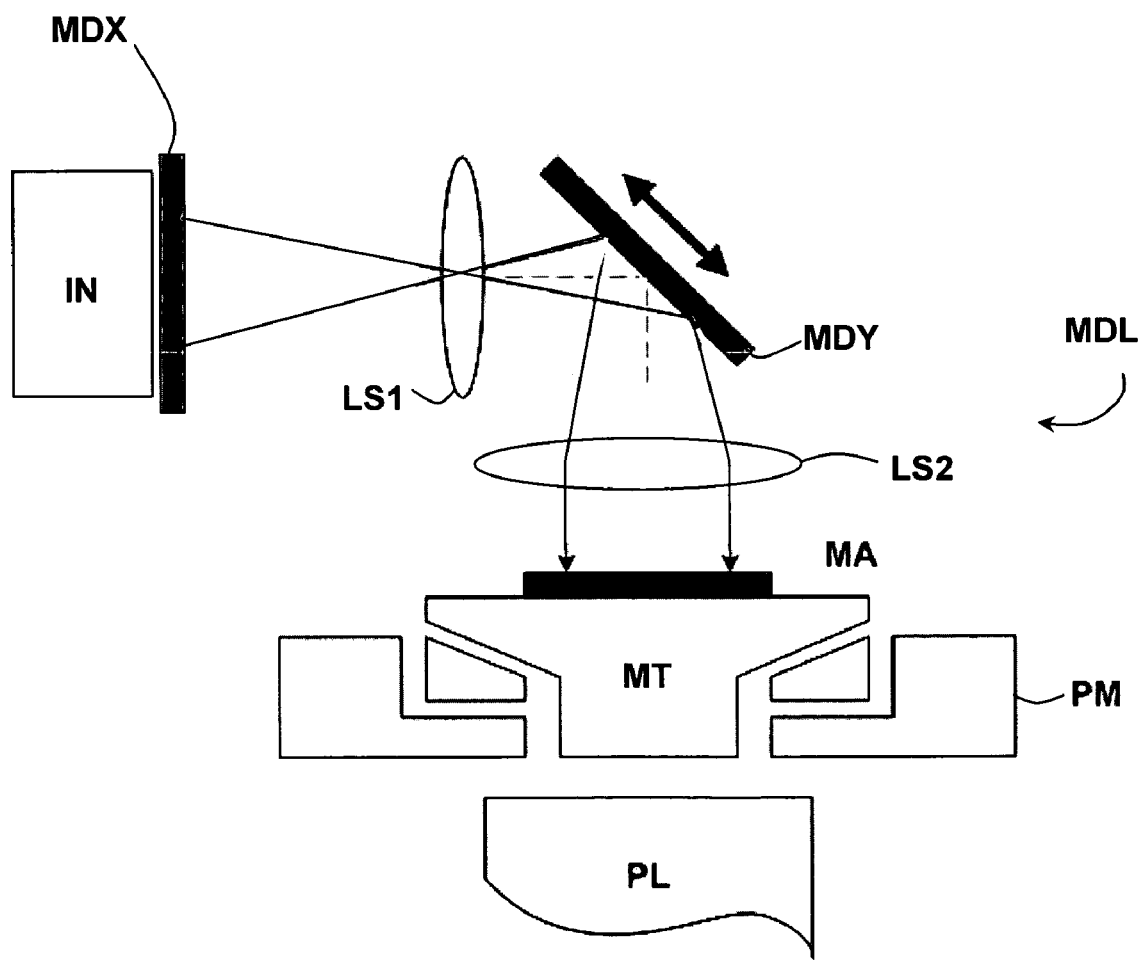
FIG. 2 shows a more detailed schematic view of the lithographic apparatus of FIG. 1.

FIGS. 1 and 2 schematically depict a lithographic apparatus according to a first embodiment of the invention. The apparatus includes an illumination system (illuminator) IL configured to provide a beam of radiation PB (e.g. UV radiation or EUV radiation); a first support (e.g. a mask table) MT configured to support patterning device (e.g. a mask) MA and connected to a first positioning device PM configured to accurately position the patterning device MA with respect to a projection system PS; a substrate table (e.g. a wafer table) WT configured to hold a substrate (e.g. a resist-coated wafer) W and connected to second positioning device PW configured to accurately position the substrate with respect to the projection system PS; and the projection system (e.g. a refractive projection lens) PS configured to project a pattern imparted to the beam of radiation PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source SO. The source SO and the lithographic apparatus may be separate entities, for example, when the source SO is an excimer laser. In such cases, the source SO is not considered to form part of the lithographic apparatus and the radiation beam is passed from the source SO to the illuminator IL with the aid of a beam delivery system BD including, for example, suitable directing mirrors and/or a beam expander. In other cases the source SO may be an integral part of the apparatus, for example, when the source is a mercury lamp. The source SO and the illuminator IL, together with the beam delivery system BD if required, may be referred to as a radiation system.

The illuminator IL may include an adjusting device AD configured to adjust the angular intensity distribution of the beam. Generally, at least the outer and/or inner radial extent (commonly referred to as a-outer and a-inner, respectively) of the intensity distribution in a pupil plane of the illuminator IL can be adjusted. In addition, the illuminator IL generally includes various other components, such as an integrator IN and a condenser (not shown). The illuminator IL provides a conditioned beam of radiation, referred to as the beam of radiation PB, having a desired uniformity and intensity distribution in its cross-section.

The beam of radiation PB is incident on the mask MA, which is held on the mask table MT. Having traversed the mask MA, the beam of radiation PB passes through the projection system PS, which projects the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1 but which may be, for example, an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X- and/or Y-direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 1 generally depicts a lithographic apparatus including a reticle masking device (masking device) MD. In the lithographic projection apparatus of FIG. 1, the radiation from source SO is transmitted as a beam of radiation PB through patterning device MA and then projected ed by projection system PS onto a target portion C. Typically, the patterning device MA includes a plurality of circuit patterns which may be selectively projected onto the target portion C. The patterning device MA has an absorbing layer, usually chrome, in a border area around the circuit pattern to prevent unwanted exposure of the substrate, W. Additionally, a masking device MD may be used to limit the area of the patterning device MA upon which the beam of radiation PB is incident to remove the need for having a wide (i.e. expensive) border area, block light that might otherwise leak through pin holes in the border area, allow only a selected circuit of the full patterning device MA to be exposed, and/or selectively block alignment marks (M1, M2) on the patterning device MA so that they are not printed on the wafer.

It should be noted that the masking device MD may be disposed either proximate the patterning device MA or in a plane that is imaged onto the patterning device MA (a conjugate plane of the patterning device). In the embodiment shown, the second option is chosen due to the practical need for room for the masking device driving device MD.

After traversing the masking device MD, the radiation beam PB passes through a masking device lens MDL. The masking device lens MDL images the masking device MD with a sufficiently small edge width onto the patterning device MA, magnifies the field to the desired size (typically by a factor of ×1 to ×4), and/or provides a uniform illumination of the patterning device MA.

The open area of the masking device MD therefore defines the area on the patterning device MA that is illuminated but may not be exactly the same as that area, e.g. if the intervening masking device lens MDL has a magnification different than 1.

It should be appreciated with reference to FIG. 1 that the position of the blades of the masking device MD determine the size and position of the area on the patterning device MA upon which the beam of radiation PB is incident.

Figure 3A:
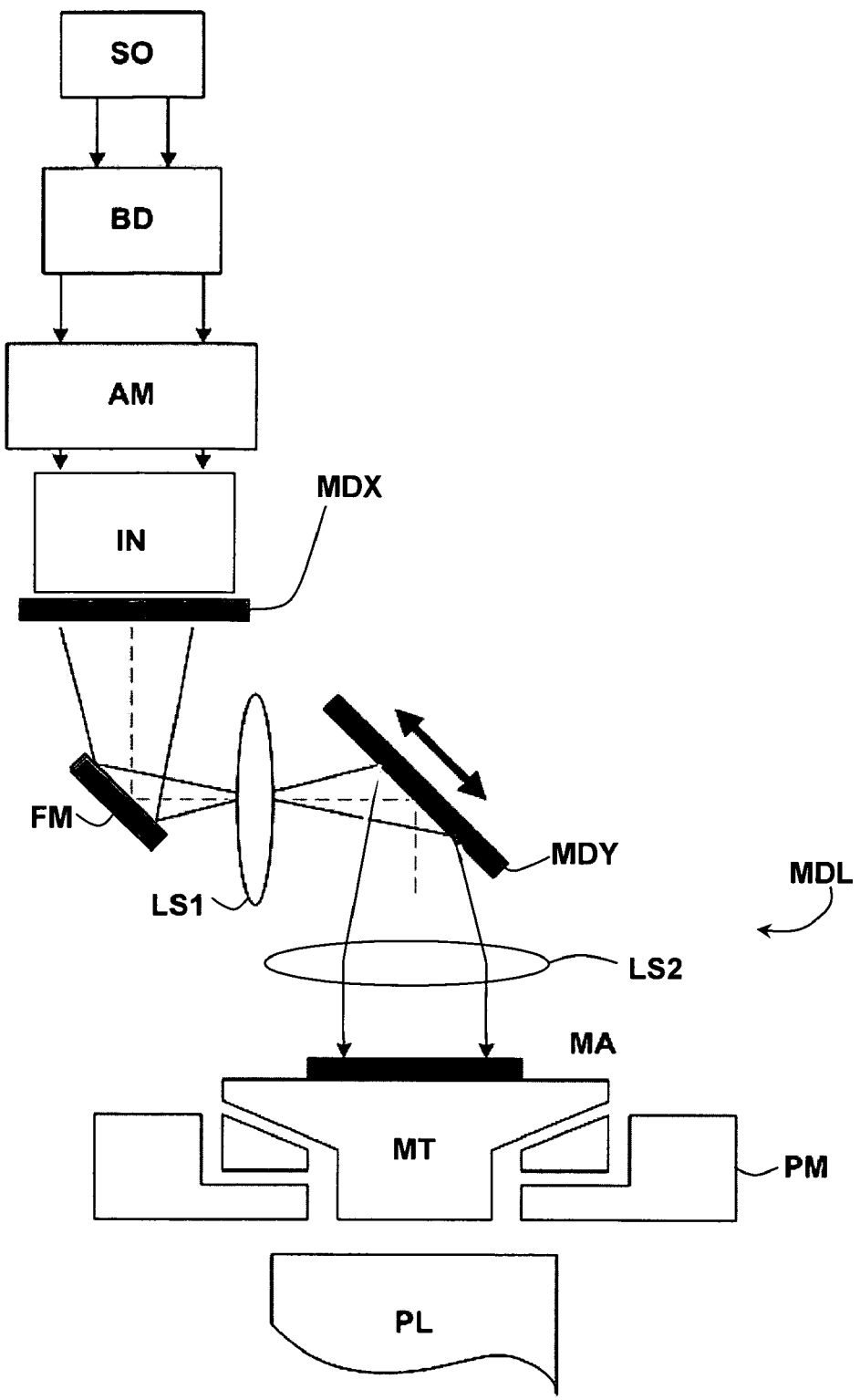
FIG. 3(a) shows a more detailed schematic view of a modified lithographic apparatus of FIG. 1.

FIG. 3(a) schematically depicts a part of the lithographic projection apparatus of FIG. 1 according to a modified embodiment of the invention. The apparatus includes: a masking device MD including masking blades MDX disposed after the integrator IN; a movable mirror or blade MDY configured and arranged between the integrator IN and the patterning device MA to direct the beam of radiation PB onto a predetermined area of the patterning device MA; a fixed mirror FM configured to direct the beam of radiation PB onto the movable mirror or blade MDY; and a masking device lens MDL, including two lenses LS1 and LS2, that images the masking device MD with a sufficiently small edge width onto the patterning device MA.

The source SO may include a radiation source (e.g. a mercury lamp, a Krypton-Fluoride excimer laser or a plasma source) that produces radiation. The source may alternatively include an Argon-Fluoride excimer laser, e.g. as a source of 193 nm radiation, or a Fluoride excimer laser, e.g. as a source of 157 nm radiation.

The radiation is fed into illumination system (illuminator) IL, either directly or after having traversed a conditioning device, including a beam delivery system BD such as a beam expander, for example. The integrator IN may, for example, be formed of a quartz rod, and is used to improve the intensity distribution of the beam to be projected over the cross-section of the beam. The integrator IN thus improves the illumination uniformity of the beam of radiation PB. In this way, the beam PB impinging on the mask MA has a desired uniformity and intensity distribution in its cross-section.

It should be noted with regard to FIG. 1 that the source SO may be within a housing of the lithographic projection apparatus, but that it may also be remote from the lithographic projection apparatus, the radiation which it produces being led into the apparatus (e.g. with the aid of suitable directing mirrors), and/or a beam expander. The present invention encompasses both of these scenarios.

After passing through the masking device MD and the masking device lens MDL, the beam PB intercepts the mask MA which is held in a mask holder on mask table MT. Having been transmitted through (or reflected by in the case of a reflective mask) the mask MA, the beam PB passes through the projection system PS, which projects the beam PB onto a target portion C of the substrate W. With the aid of the second positioning device (e.g. an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realised with the aid of a long stroke module (coarse positioning) and a short stroke module (fine positioning), which are not explicitly depicted in FIGS. 1 and 2. However, in the case of a wafer stepper (as opposed to a step-and-scan apparatus) the mask table MT may just be connected to a short stroke actuator, or may be fixed.

As mentioned above, the depicted apparatus can be used in two different modes:

1. In step mode, the mask table MT is kept essentially stationary, and an entire mask image is projected at once (i.e. a single "flash") onto a target portion C. The substrate table WT is then shifted in the X- and/or Y-directions so that a different target portion C can be irradiated by the beam PB.

2. In scan mode, essentially the same scenario applies, except that a given target portion C is not exposed in a single "flash". Instead, the mask table MT is movable in a given direction (the so-called "scan direction", e.g. the Y-direction) with a speed v, so that the mask image is scanned through the beam of radiation PB; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The present invention is particularly applicable to the scan mode. However, the invention is not limited in terms of its applicability to synchronous scanning where the masking device MD is arranged to move together with the patterning device, it may also be employed where the movement profile of the masking device differs from that of the patterning device.

Figure 3B:
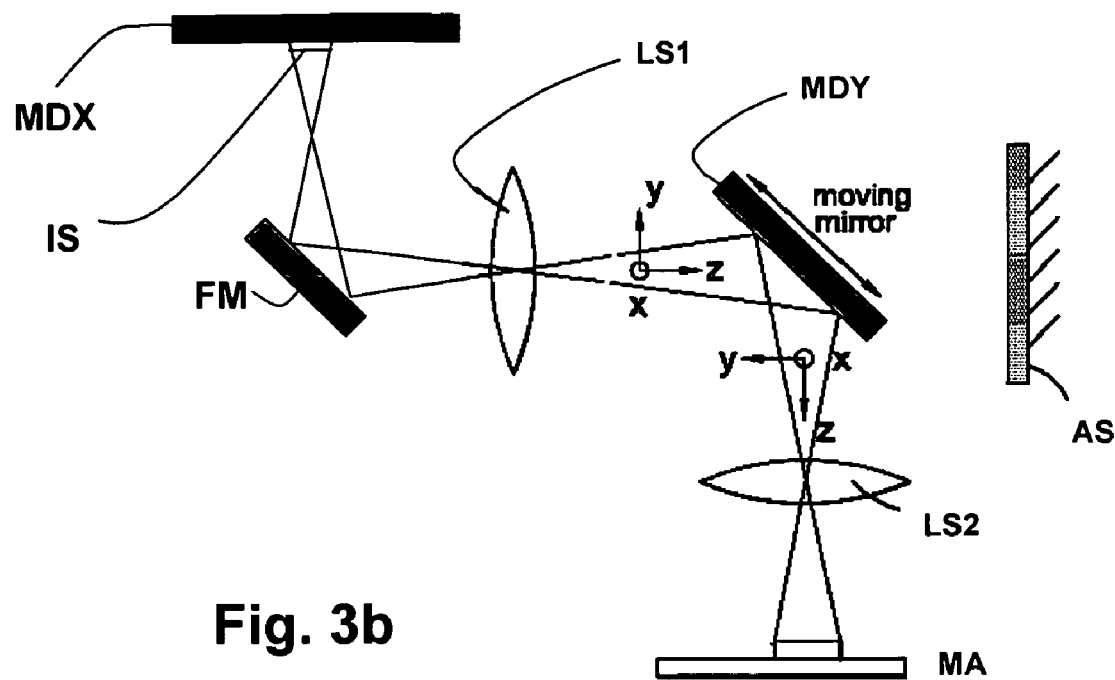
FIG. 3(b) shows a schematic view of part of the lithographic apparatus of FIG. 1.

FIG. 3(b) shows a schematic view of part of the lithographic apparatus of FIG. 3(a), in which the masking device MD includes a single movable mirror Y-blade MDY.

Figure 4:
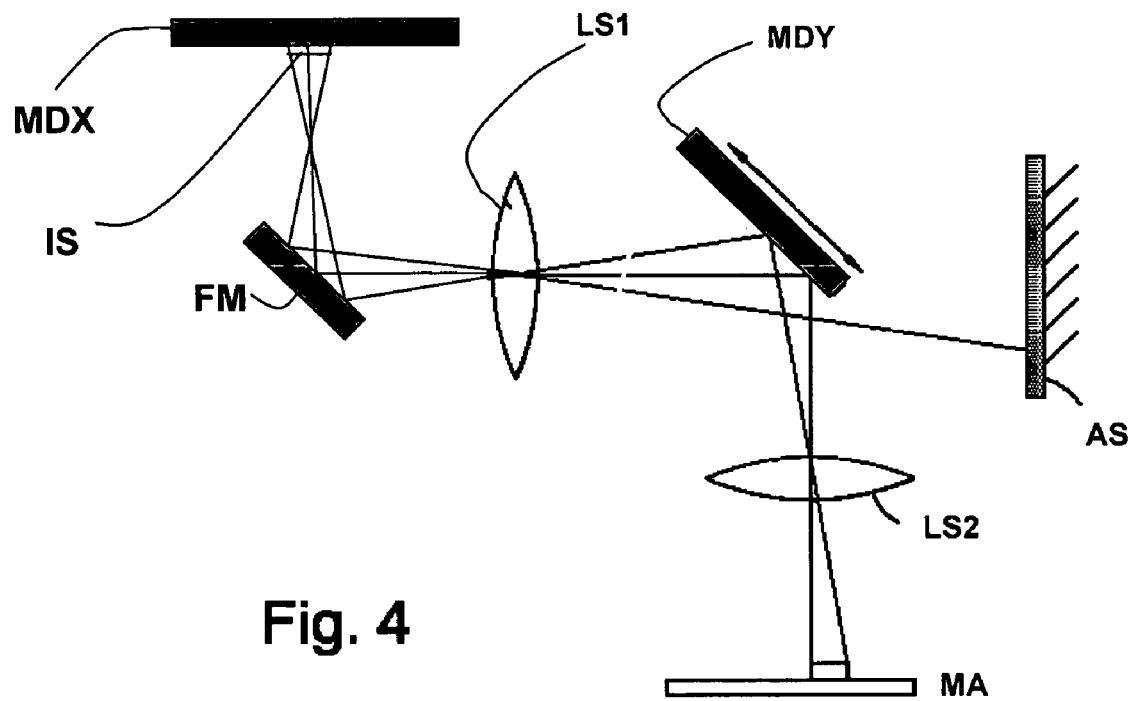
FIG. 4 shows a further schematic view of the part of the lithographic apparatus of FIG. 3(b), in use.

An illumination slit IS is generated by the illumination system and the masking blades MDX. The illumination slit IS is projected onto the tilted mirror MDY through a lens LS1. Note that in FIG. 3(b), only one lens is shown, while in practice a number of optical elements could together form the lens LS1. The mirror MDY reflects the light towards, a second lens LS2, which focuses the illumination slit IS onto the mask MA. The mirror MDY is moveable in a direction along its plane, such that it can be moved in and out of the beam of radiation. When the mirror MDY is partly moved out of the beam of radiation PB as shown in FIG. 4, part of the illumination slit IS is no longer projected onto the mirror MDY, but is passed to a light absorbing surface AS behind the mirror MDY. The area illuminated on the patterning device MA is also proportionally smaller.

The light absorbing surface AS absorbs the light that falls onto it. An unacceptable temperature rise may be solved by cooling the absorbing surface AS. If the light absorbing surface AS is fixed (i.e. non-moving object), cooling channels and hoses can more easily be connected.

Figure 5:
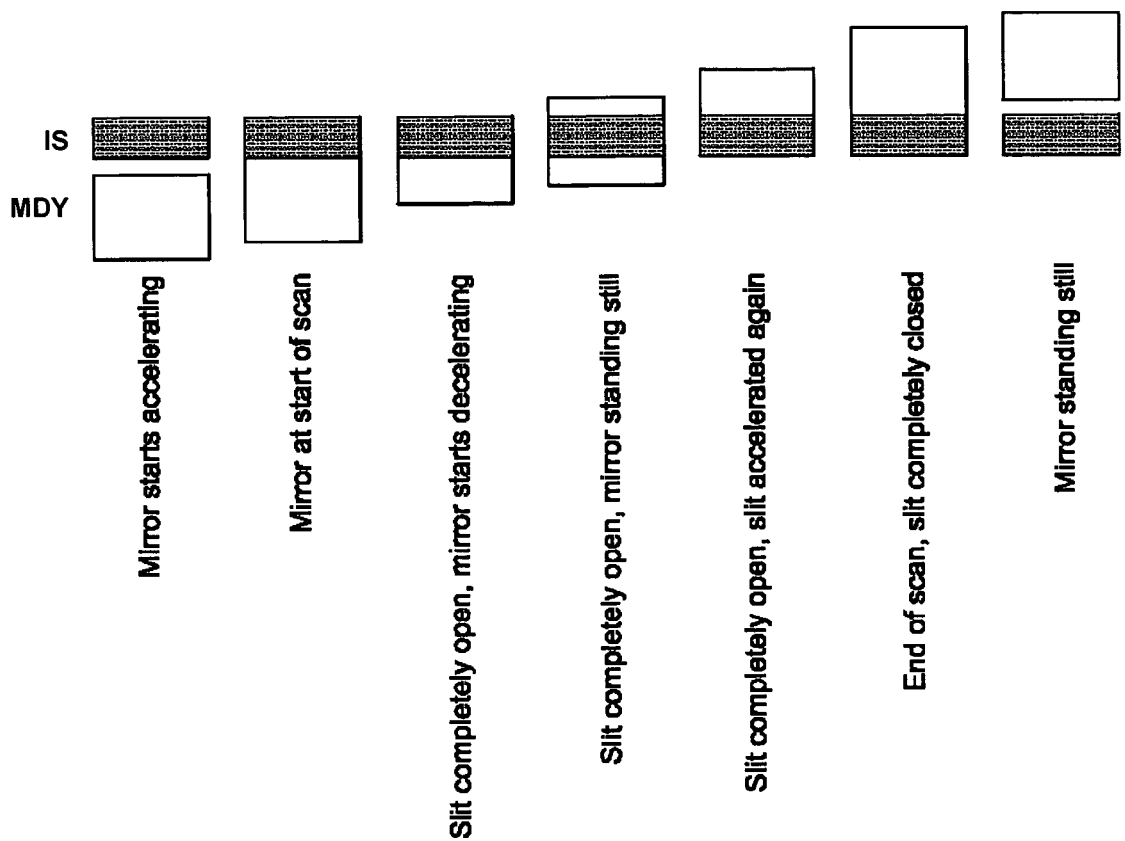
FIG. 5 shows a series of schematic views of an effective slit as seen by a mask or reticle.

In a normal exposure cycle, the illuminated area on the mask MA is increased from zero to maximum. At the end of the scan, the illuminated area is decreased to zero again. Hence, the mirror movement relative to the illumination slit IS can be depicted as in FIG. 5. Referring to FIG. 3(b), radiation or light on a path towards the mask MA is reflected by the mirror or blade MDY. At the start of the scan, the reflecting blade MDY is outside the light path, moving in the illumination beam at the start of the scan. Note that FIG. 3(b)

only depicts one disposition of MDY, the mirror MDY may also be beneficially positioned in a focal plane.

In the embodiment depicted in FIG. 3(a), the moving mirror MDY only controls the amount of light in the scanning Y-direction. In the X-direction, the illumination region on the mask MA also has to be defined. This can be done with X-blades MDX suitably located in the illuminator IL, in this case immediately downstream of the integrator IN.

Figure 6:
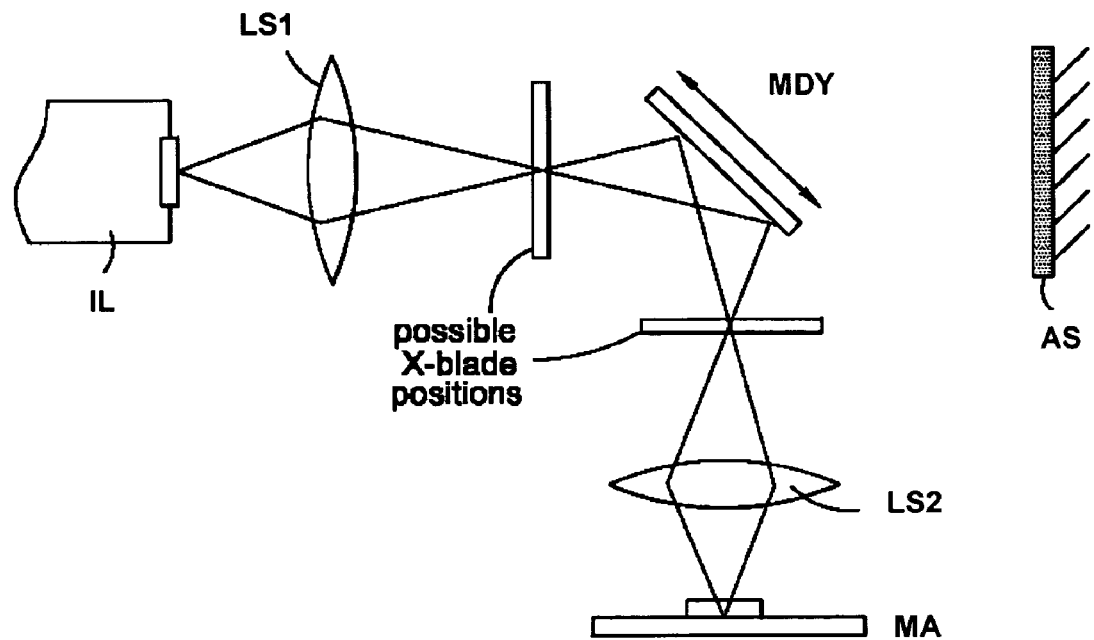
FIG. 6 shows a schematic view of the part of the lithographic apparatus.
Figure 7:
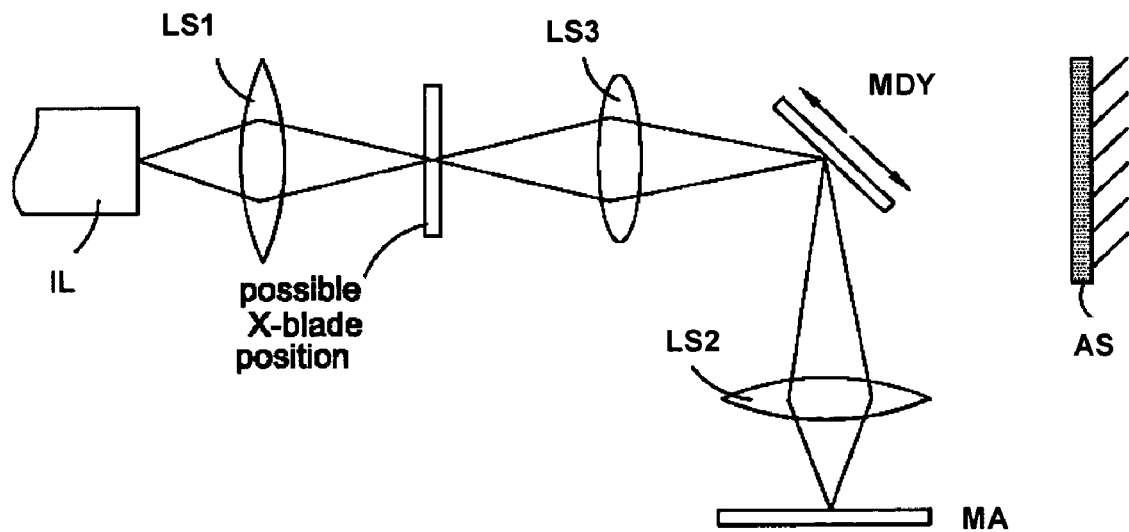
FIG. 7 shows a schematic view of the part of the lithographic apparatus according to a modified implementation.

Alternatively, the X-blades may be positioned either upstream or downstream of the reflecting mirror MDY, as shown in FIG. 6. Note that the X-blades MDX are positioned in a focal plane of the lens system MDL, for which purpose extra lens elements LS3 may be inserted, as depicted in FIG. 7. In the arrangement of FIG. 7 the mirror MDY is placed in focus.

Figure 8:
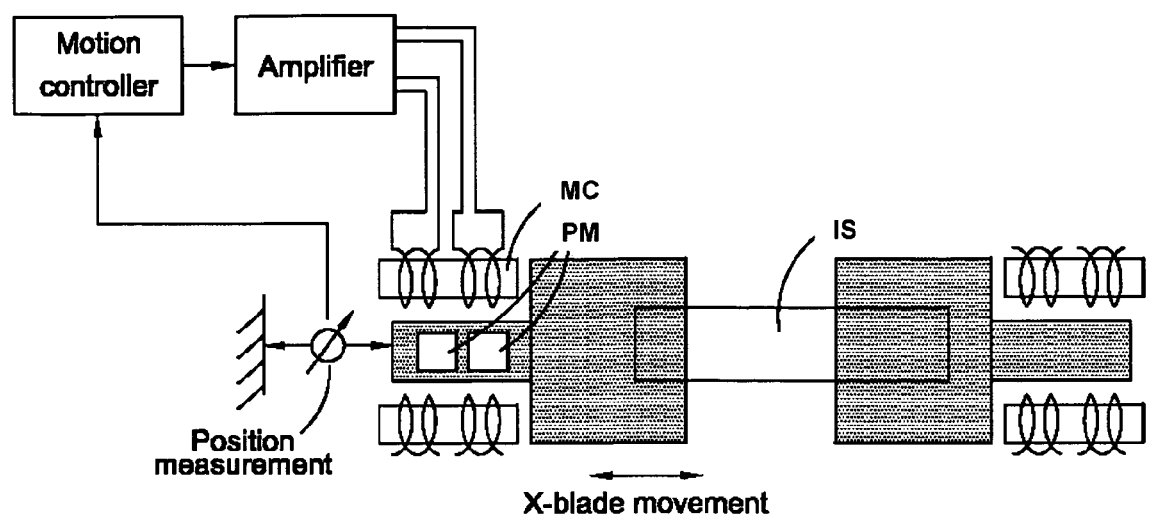
FIG. 8 shows a schematic view of a construction around X-blades of the lithographic apparatus.

FIG. 8 shows a possible construction surrounding the X-blades. The X-blades block the light in the non-scanning (X-) direction. Two X-blades are provided, for the left and right side of the illumination slit IS. To each X-blade a motor is attached having permanent magnets PM in the moving part, interacting with a magnetic field generated in a number of coils MC in the stator. These coils MC are connected to an amplifier that drives a current through the coils MC. This current depends on the actual position of the magnets PM with respect to the coils MC (commutation), and also depends on the required acceleration at a particular moment. The amplifier is connected to a motion controller, which is usually implemented by a digital computer, and determines the required motor current based on the movement profile and the actually measured blade position. The motion controller interfaces with a higher level of machine control that determines the required reticle masking movements.

The X-blades are normally in a fixed position during an exposure scan. The X-blades are only moved between exposures. Hence, cooling of the X-blades, which is required because of the light absorbed by them, can be performed by running cooling water through parts of the moving body of the X-blade. Because movements do not take place very often, lifetime requirements on cooling channels connecting the moving part to fixed parts are easily fulfilled. Of course, this is not true for the scanning Y-blade that delimits the illuminated area at the start and end of the scan, because such Y-blade performs scanning movements for each exposure.

Figure 9:
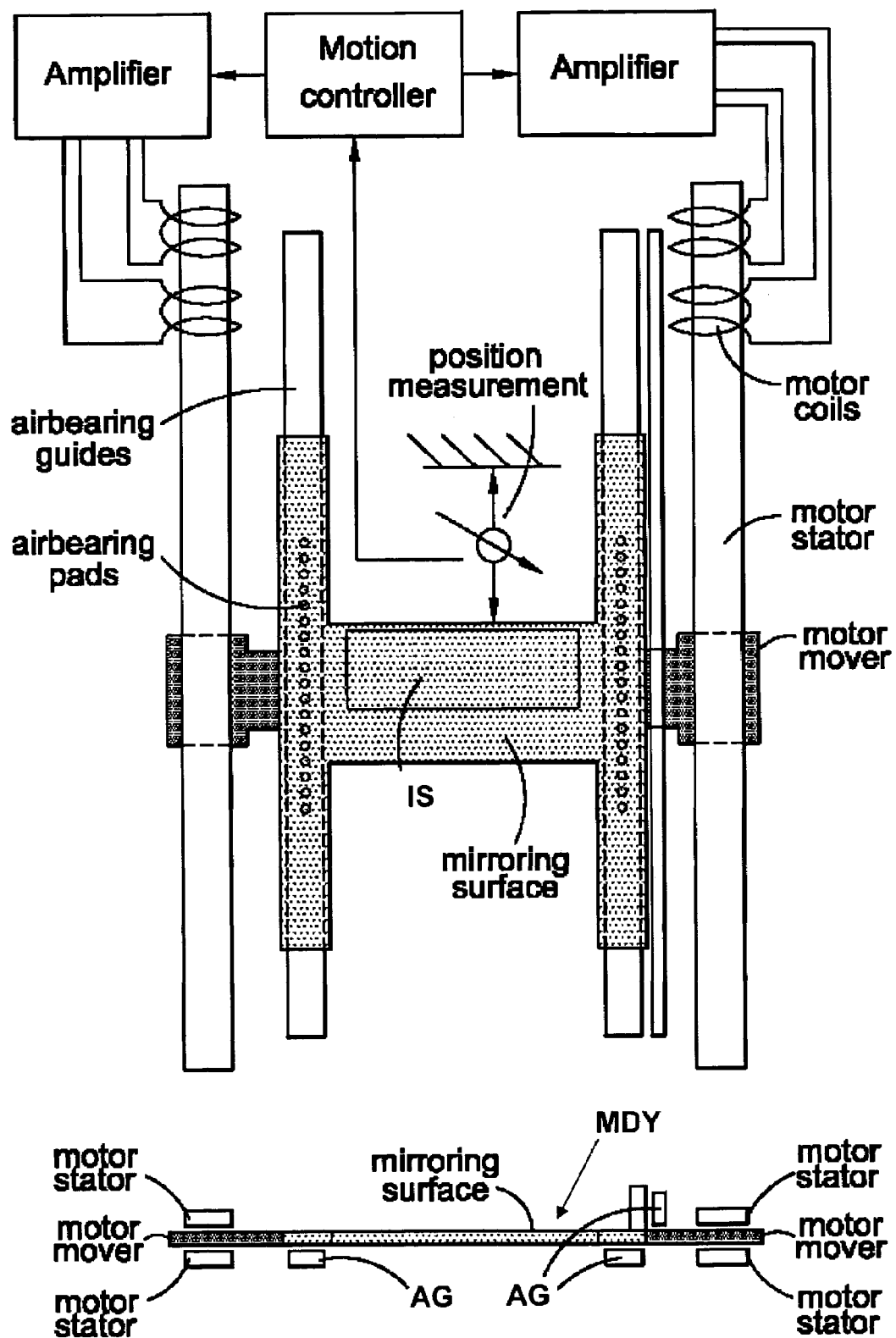
FIG. 9 shows a schematic view of a construction around a reflective Y-blade of the lithographic apparatus.
Figure 10:
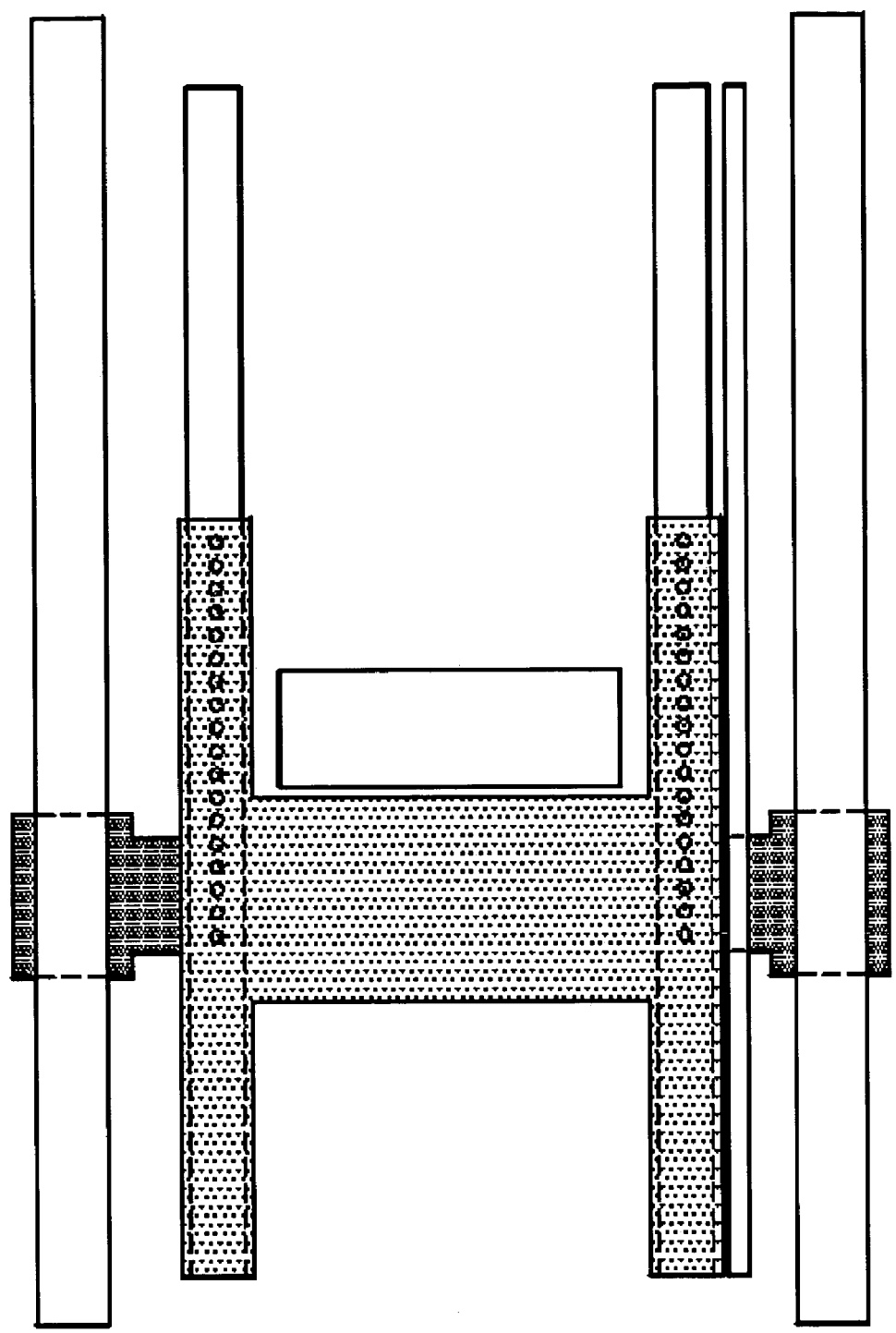
FIG. 10 shows a further schematic view of the construction around the reflective Y-blade of the lithographic apparatus.

FIG. 9 shows a possible construction surrounding the mirror or mirroring blade MDY. The mirror blade MDY is guided by, for example, air bearings having air bearing guides AG in all but the scanning direction. Each air bearing includes a static part, formed as a flat guiding surface with small holes through which air is flowing. The airflow lifts the mirror blade MDY off its guiding surface. To avoid hoses connected to the moving part, the air may be provided through the static part. However, when moving, the mirror blade MDY should cover all holes in the guiding surface. In addition, the length of a 'hole' region in the static part should have a certain minimum size to allow the air bearing to work properly. To allow the moving part to cover the holes in the static part at all times, the mirror blade MDY is extended in the scanning directions at the right and left side, giving the moving construction an H-like shape. FIG. 10 shows the situation with the mirror blade MDY out of the illuminating area. It is seen that all holes in the airbearing stator are still covered. Note that three airbearings are drawn: two fixing the mirror blade in Z-direction and one in X-direction.

Also shown in FIG. 9 are two motors: one on the left side and one on the right side of the mirror blade MDY. Two motors are chosen to be able to drive the moving part in its center of mass. In addition, a large thrust is possible by driving the mirror blade MDY by two instead of one motor. Each motor includes a stator including a number of coils, and a mover holding permanent magnets. As in the X-blade case, this allows the motor to be operated without cables to the moving part. Again, the motors are connected to an amplifier which in turn is connected to a motion controller. The motion controller uses a position measurement signal to determine the required current through the coils. These parts all have similar functions as in the X-blade case.

Turning now to the movement of the mirror blade MDY, in use. The speed with which the mirror blade MDY enters and leaves the illumination slit is equal to the speed of the mask MA. If optics between the mirror blade MDY and the mask MA magnify or demagnify the image of the illumination area on the mask MA, the speed is changed proportionally. The required travel distance of the mirror blade MDY to reach the scanspeed depends on the acceleration and jerk (the derivative of the acceleration) of the mirror blade MDY. In order not to let the mirror blade MDY determine the machine throughput, the acceleration and jerk of the mirror blade MDY must at least be equal to the mask acceleration and jerk. Also, the movement distance when coming to a stop (steps 3 and 4 in FIG. 5) depends on these parameters, and hence the minimum pattern size depends on these parameters. All these aspects call for a significantly higher acceleration and jerk, in the order of magnitude of 5 to 10 times larger than that of the reticle. The following table lists these parameters.

| | |
|---|---|
| Reticle jerk | 2000 m/s$^3$ |
| Reticle acceleration | 50 m/s$^2$ |
| Reticle scan speed | 2 m/s |
| Mirroring blade jerk | 20000 m/s$^3$ |
| Mirroring blade acceleration | 250 m/s$^2$ |
| Mirroring blade speed | 2 m/s |
| Mirroring blade size | Illumination slit + 2 × distance required to accelerate = Illumination slit + 2 × 20 mm |

In the above table, the mirror blade MDY jerk is chosen 10 times as high as that of the mask MA, while the mirror blade MDY acceleration is chosen 5 times as high as that of the mask. The projected image of the mirror blade MDY must move at the same speed as the mask MA. With these parameters, a distance of 20 mm is travelled during acceleration of the mirror blade MDY, bringing it from a standstill to a speed of 2 m/s. Also, after it has entered the illuminated area completely, it needs 20 mm to slowdown to a standstill, and requires another 20 mm to accelerate to 2 m/s at the end of the scan (step 5 in FIG. 5). Hence, the total mirror blade MDY size in Y-direction equals the illumination area plus 2×20 mm. With an illumination area of 40 mm, the mirror blade MDY size in Y-direction becomes 80 mm. In the X-direction, the mirror blade MDY size is slightly larger than the illumination area in X-direction, which is in the order of 100 mm. A mirror blade MDY this size, having a thickness in the order of 1 mm, and including permanent magnets for the motors, can have a weight in the order of 200 g. The required force during the acceleration phase is then 250 m/s$^2$×0.2 kg=50 N, which is possible. Increasing the acceleration of the mirror blade MDY hence allows making it smaller and lighter.

Figure 11A:
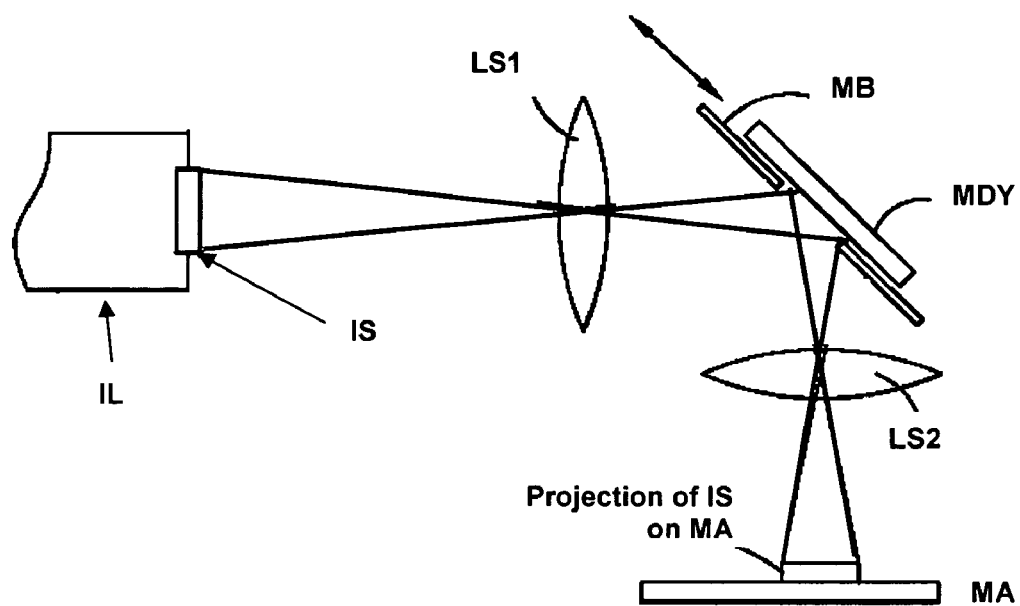
FIG. 11(a) shows a schematic view of part of a lithographic apparatus according to a second embodiment of the present invention.
Figure 11B:
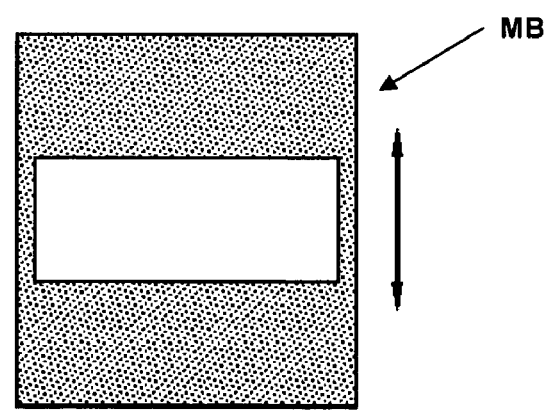
FIG. 11(b) shows a planar view of a non-reflecting blade for use in the lithographic apparatus of FIG. 11(a)

Referring now to FIG. 11(a), there is shown a schematic view of part of a lithographic apparatus according to a second embodiment of the present invention. In this embodiment, a non-reflecting blade MB with a hole or slit in it is located and moved in front of a fixed mirror MDY. The non-reflecting blade MB is shown in FIG. 11(b). Now, the scanning non-reflecting blade MD blocks light that is not to be transported to the mask MA. The thermal dissipation advantage is now gone, but still only one blade MB may be required.

In a modification the moving blade MB with slit may be made reflective and the fixed mirror MDY removed. In such instance, radiation passing through the slit may pass to the mask or reticle MA.

Figure 12:
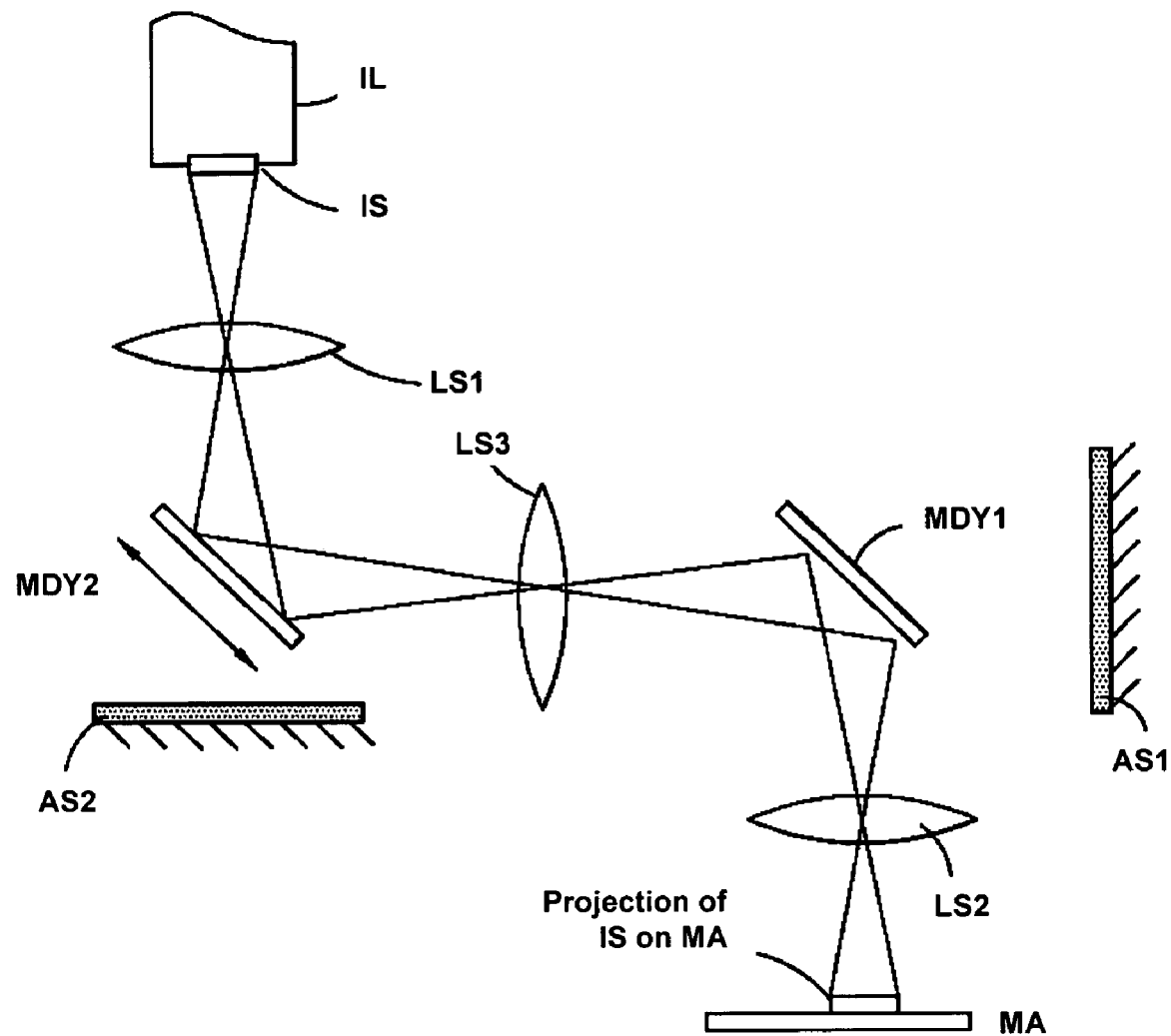
FIG. 12 shows a schematic view of part of a lithographic apparatus according to a third embodiment of the present invention.

Referring to FIG. 12, there is shown a schematic view of part of a lithographic apparatus according to a third embodiment of the present invention. In addition to the one mirror blade MDY1 as in the first embodiment, a second mirror blade MDY2 can be used, as shown in FIG. 12. Both these blades MDY1, MDY2 are moveable, similar to the one mirror blade MDY situation. Two mirror blades MDY1, MDY2 could be used for images smaller than the illumination slit IS. At the start of the scan, one blade MDY1, MDY2 is already positioned completely in the illuminating slit IS, while the second blade MDY2, MDY1 is positioned outside the illuminated slit IL. The second blade MDY2 is then moved into the illuminated slit IL together with the starting edge of the mask MA, as described in the first embodiment. At the end of the scan, the first blade is moved out of the illumination slit IL together with the trailing edge of the image on the mask MA. So, while one of the mirror blades MDY1, MDY2 is used at the start of the scan, the other blade MDY1, MDY2 is used at the end of the scan. This allows one edge to be defined by one blade MDY1 and the other edge defined by the other blade MDY2, e.g. images smaller than the size of the illumination slit IL can be exposed. This embodiment does not have the heat dissipation of the embodiment with only one blade MDY, but does deal with the dissipation issue effectively.

Figure 13:
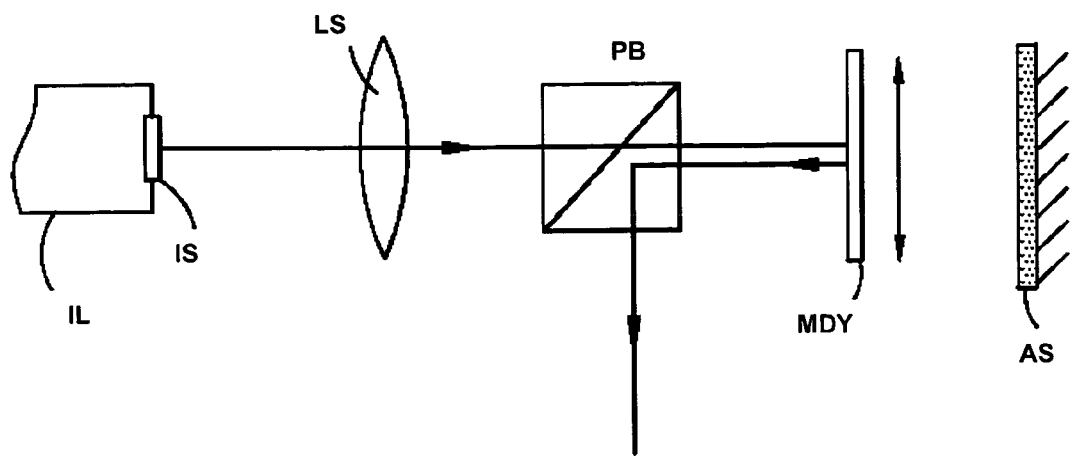
FIG. 13 shows a schematic view of part of a lithographic apparatus according to a fourth embodiment of the present invention.

Referring now to FIG. 13 there is shown a schematic view of part of a lithographic apparatus according to a fourth embodiment of the present invention. In this fourth embodiment using a mirror blade MDY there is also used a polarizing beamsplitter PBS. In this embodiment, the illuminating source IL produces radiation or light polarized in one direction only. The light completely passes the polarizing beamsplitter PBS, and is reflected off the mirror blade MDY. The mirror blade MDY now uses a quarter-lambda waveplate, which has the characteristic that it adds a phase change of 90°. The reflected light now returns to the polarizing beamsplitter PBS, and because of its 90° change in phase it is now reflected downwards (in the diagram). Similar to the previous embodiments, the part of the illumination beam or light that reaches the mask MA is determined by the mirror MDY blade.

Figure 14:
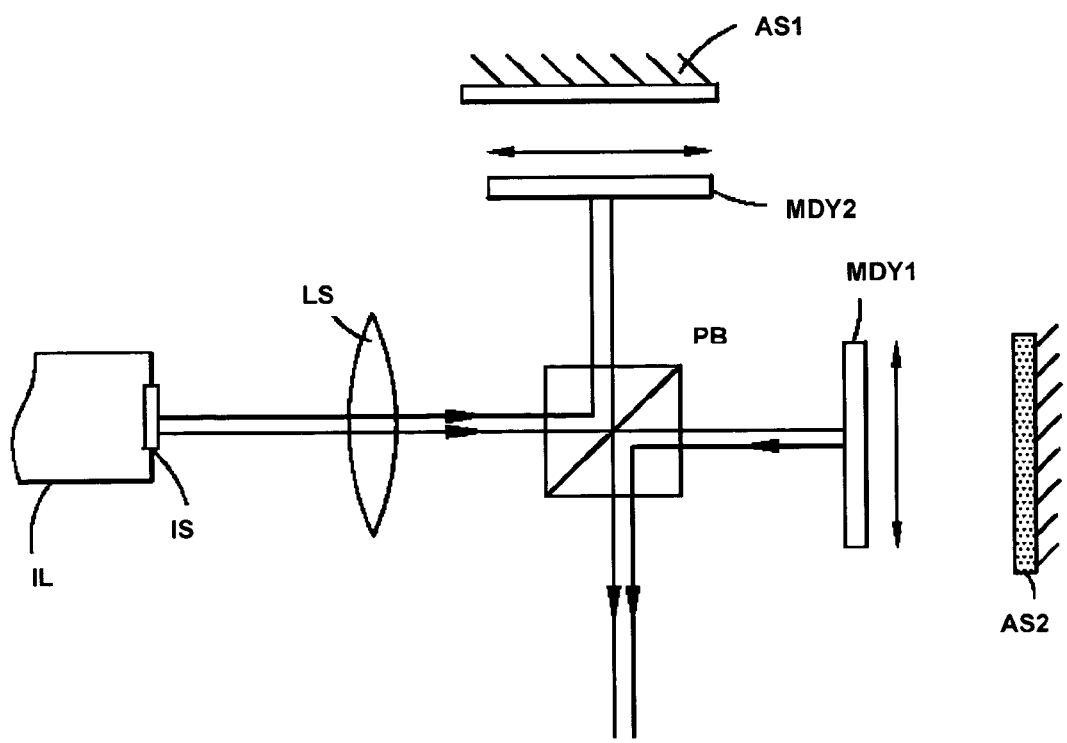
FIG. 14 shows a schematic view of the part of the lithographic apparatus of FIG. 13 according to a first modified implementation.

In the case that it is not desired to have the light polarized in one direction only, or if the illuminating system IL produces light randomly polarized, a system with two moving mirrors MDY1, MDY2 can be used, as shown in FIG. 14. In this case, light polarized in the opposite direction from the illuminating system IL is reflected in the upward direction (in the diagram) by the polarizing beamsplitter PBS. A second mirror blade MDY2 rotates the polarization and reflects the light downwards, where it now passes the beamsplitter PBS a second time. The output of the beamsplitter PBS now contains both original polarization directions.

Figure 15:
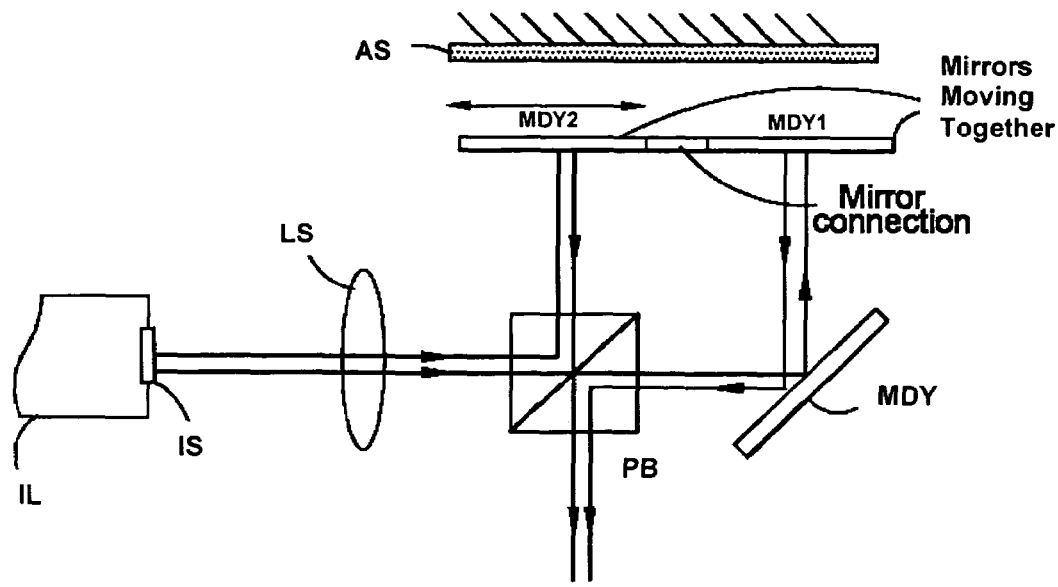
FIG. 15 shows a schematic view of the part of the lithographic apparatus of FIG. 13 according to a second modified implementation.
Figure 16:
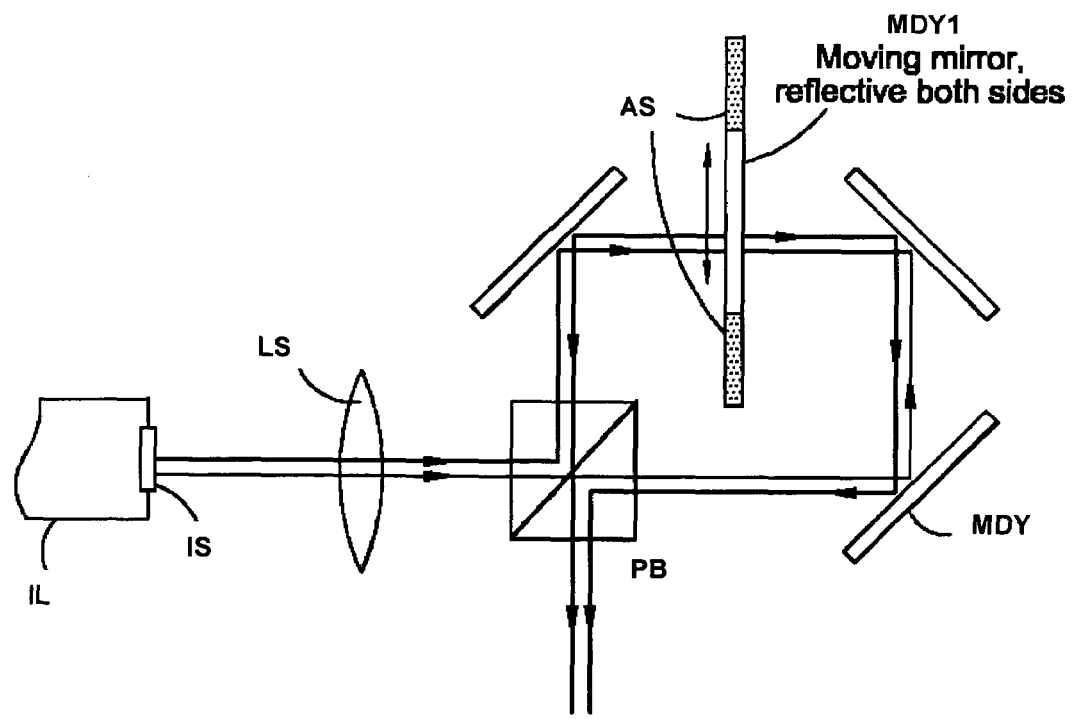
FIG. 16 shows a schematic view of the part of the lithographic apparatus of FIG. 13 according to a third modified implementation.
Figure 17A:
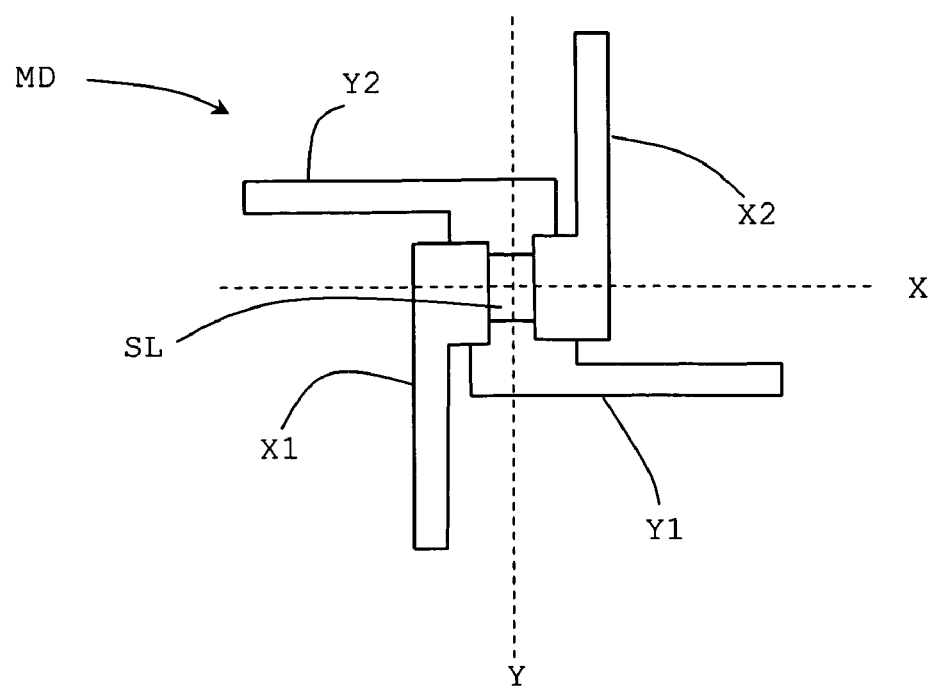
FIGS. 17(a) and 17(b) a conventional masking device MD of a lithographic apparatus similar to that of FIG. 1 disposed in an XY plane.
Figure 17B:
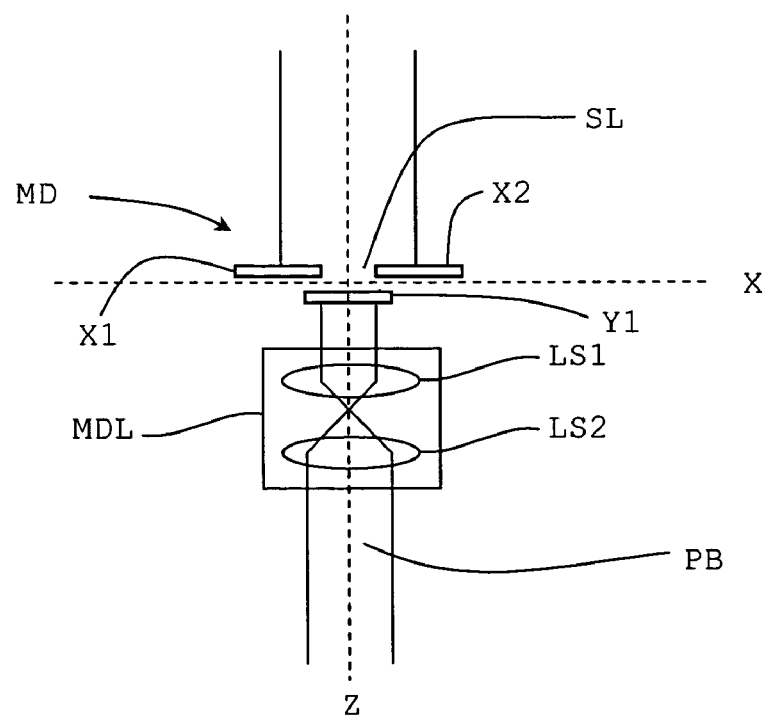

Note that it is also possible to use only one moving mirror blade MDY with the same effect, examples of which are shown in FIG. 15 and FIG. 16.

In FIG. 15, there is provided a fixed mirror MDY. The illumination beam passing the beamsplitter PBS in a straight way is now reflected upwards, onto a mirror MDY2 that is connected to the first moving mirror MDY1. Hence, the two mirrors in FIG. 14 are combined on one movable platform.

In FIG. 16, there is provided a fixed mirror MDY. A single reflective mirror MDY1 is used that has reflective properties at both surfaces. The two polarization directions are directed towards both mirror surfaces, hence again needing only one moveable element. Note that in this case, the light absorbing surface is combined with the moving mirror, and hence the dissipation advantage is gone.

While specific embodiments of the present invention have been described above, it will be appreciated that the present invention may be practiced otherwise than as described. The description is not intended to limit the invention.

What is claimed is:

1. A lithographic apparatus, comprising:
   an illumination system configured to condition a beam of radiation;
   a support configured to support a patterning device, the patterning device being configured to impart the beam of radiation with a pattern in its cross-section;
   a substrate table configured to hold a substrate;
   a projection system configured to project the patterned beam onto a target portion of the substrate; and
   a masking device configured to obscure a portion of the patterning device from the beam of radiation and comprising a reflective element configured to reflect a portion of the beam of radiation toward the substrate, wherein the amount of the portion after reflection is variable due to the reflective element.

2. A lithographic apparatus according to claim 1, wherein the reflective element comprises a reflective blade.

3. A lithographic apparatus according to claim 2, wherein the reflective blade is a mirror blade.

4. A lithographic apparatus according to claim 1, further comprising a reflective element moving device configured to move the reflective element.

5. A lithographic apparatus according to claim 1, wherein the masking device comprises a movable radiation absorbing blade having a slit.

6. A lithographic apparatus according to claim 1, wherein the reflective element comprises a hole or slit through which radiation passes.

7. A lithographic apparatus according to claim 1, wherein the reflective element comprises a single reflective blade disposed and movable in a manner so as to provide the obscuring in a Y-direction perpendicular to a Z-direction, which Z-direction comprises a direction of passage of the beam of radiation.

8. A lithographic apparatus according to claim 7, wherein the Y-direction comprises a scanning direction.

9. A lithographic apparatus according to claim 8, wherein, at the start of a scan, the single reflective blade is movable in a direction into the beam of radiation such that an effective slit is opened, when the effective slit provided by the single reflective blade is open the single reflective blade is stopped, and at the end of a scan the single reflective blade is movable in a same direction such that the effective slit is closed.

10. A lithographic apparatus according to claim 7, wherein the obscuring in a X-direction, perpendicular to the Z- and Y-directions, is provided by a pair of X-blades, the X-blades being movable in relation to one another.

11. A lithographic apparatus according to claim 1, wherein the reflective element is disposed in the illumination system.

12. A lithographic apparatus according to claim 1, wherein the reflective element is disposed to intersect an input radiation path at an acute angle.

13. A lithographic apparatus according to claim 1, wherein the reflective element comprises a quartz substrate coated with $SiO_2/Al_2O_3$.

14. A lithographic apparatus according to claim 10, wherein the X-blades are disposed in a focal plane of the illumination system.

15. A lithographic apparatus according to claim 4, wherein the reflective element moving device comprises first and second motors.

16. A lithographic apparatus according to claim 1, wherein the masking device comprises a first masking device configured to obscure part of a location at which the patterning device is supported in a first direction and a second masking device configured to obscure part of the location in a second different direction.

17. A lithographic apparatus according to claim 16, wherein the first masking device comprises the reflective element, and the second masking device comprises a pair of blades.

18. A lithographic apparatus according to claim 1, wherein the reflective element comprises first and second reflective elements.

19. A lithographic apparatus according to claim 1, further comprising a polarizer configured to polarize the beam of radiation.

20. A lithographic apparatus according to claim 1, wherein the beam of radiation is obscured by the masking device prior to exposure to the patterning device.

21. A masking device comprising a reflective element configured to mask a beam of radiation in a lithographic apparatus and the reflective element is configured to reflect a portion of the beam of radiation toward a substrate, wherein the amount of the portion after reflection is variable due to the reflective element.

22. A masking device according to claim 21, wherein the masking device comprises a movable radiation absorbing blade having a slit.

23. A masking device according to claim 21, wherein the reflective element comprises a single reflective blade disposed and movable in a manner so as to obscure the beam of radiation in a Y-direction perpendicular to a Z-direction, which Z-direction comprises a direction of passage of the beam of radiation and the Y-direction comprises a scanning direction of the substrate.

24. A masking device according to claim 23, wherein the masking device is configured to, at the start of a scan, move the single reflective blade in a direction into the beam of radiation such that an effective slit is opened, to stop the single reflective blade when the effective slit is open, and, at the end of a scan, move the single reflective blade in a same direction such that the effective slit is closed.

25. A masking device according to claim 23, further comprising a pair of X-blades, the X-blades being movable in relation to one another, configured to obscure the beam of radiation in a X-direction, perpendicular to the Z- and Y-directions.

26. A masking device according to claim 21, wherein the masking device comprises a first masking device configured to Obscure part of a location at which the patterning device is supported in a first direction, the first masking device comprising the reflective element, and a second masking device configured to obscure part of the location in a second different direction, the second masking device comprising a pair of blades.

27. A masking device according to claim 21, wherein the reflective element comprises first and second reflective elements.

28. A device manufacturing method, comprising:
providing a beam of radiation using an illumination system;
using a patterning device to impart the beam of radiation with a pattern in its cross-section;
projecting the patterned beam of radiation onto a target portion of a substrate;
masking a portion of the patterning device from the beam of radiation using a masking device comprising a reflective element reflecting a portion of the beam of radiation toward the substrate, wherein the amount of the portion after reflection is variable due to the reflective element.

29. A method according to claim 28, wherein the reflective element is fixed and comprising moving a radiation absorbing blade having a slit.

30. A method according to claim 28, wherein the reflective element comprises a single reflective blade and comprising moving the single reflective blade so as to provide the masking in a Y-direction perpendicular to a Z-direction, which Z-direction comprises a direction of passage of the beam of radiation and the Y-direction comprises a scanning direction of the substrate.

31. A method according to claim 30, comprising, at the start of a scan, moving the single reflective blade in a direction into the beam of radiation such that an effective slit is opened, stopping the single reflective blade when the effective slit is open, and, at the end of a scan, moving the single reflective blade in a same direction such that the effective slit is closed.

32. A method according to claim 30, further comprising providing the masking in a X-direction, perpendicular to the Z- and Y-directions, using a pair of X-blades, the X-blades being movable in relation to one another.

33. A method according to claim 28, comprising obscuring part of a location at which the patterning device is supported in a first direction using a first masking device comprising the reflective element, and obscuring part of the location in a second different direction using a second masking device comprising a pair of blades.

34. A method according to claim 28, wherein the reflective element comprises first and second reflective elements.

* * * * *